United States Patent
Selvamanickam et al.

(10) Patent No.: US 7,338,683 B2
(45) Date of Patent: *Mar. 4, 2008

(54) SUPERCONDUCTOR FABRICATION PROCESSES

(75) Inventors: Venkat Selvamanickam, Wynantskill, NY (US); Xuming Xiong, Niskayuna, NY (US)

(73) Assignee: Superpower, Inc., Schenectady, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 10/842,619

(22) Filed: May 10, 2004

(65) Prior Publication Data

US 2005/0249869 A1     Nov. 10, 2005

(51) Int. Cl.
  *H01L 39/24* (2006.01)
  *B05D 5/12* (2006.01)
  *C23C 14/08* (2006.01)
  *C23C 14/48* (2006.01)
  *C23C 14/54* (2006.01)

(52) U.S. Cl. .................. 427/8; 427/523; 427/529; 427/533; 427/595; 505/434; 505/480

(58) Field of Classification Search .............. 505/325, 505/430, 434, 480; 427/8, 10, 523, 526, 427/528, 529, 533, 595
See application file for complete search history.

(56) References Cited

U.S. PATENT DOCUMENTS

| | | | |
|---|---|---|---|
| 4,687,987 A | 8/1987 | Kuchnir et al. | |
| 4,878,014 A | 10/1989 | Simpson | |
| 5,196,399 A * | 3/1993 | Shiota et al. | 65/443 |
| 5,198,676 A * | 3/1993 | Benveniste et al. | 250/397 |
| 5,554,926 A | 9/1996 | Elmer et al. | |
| 5,650,378 A * | 7/1997 | Iijima et al. | 505/473 |
| 5,744,812 A | 4/1998 | Oh et al. | |
| 5,903,002 A | 5/1999 | Turner et al. | |
| 5,958,157 A * | 9/1999 | Crow et al. | 148/565 |
| 6,190,752 B1 * | 2/2001 | Do et al. | 428/141 |
| 6,214,772 B1 * | 4/2001 | Iijima et al. | 505/475 |
| 6,300,642 B1 * | 10/2001 | Cho et al. | 250/492.21 |
| 6,300,755 B1 | 10/2001 | Elmer et al. | |
| 6,452,165 B1 | 9/2002 | Schwieters | |
| 6,528,805 B2 * | 3/2003 | Fang et al. | 250/492.21 |
| 6,632,539 B1 * | 10/2003 | Iijima et al. | 428/472 |
| 6,797,313 B2 * | 9/2004 | Fritzemeier et al. | 427/62 |
| 6,849,580 B2 | 2/2005 | Norton et al. | |
| 6,858,854 B2 * | 2/2005 | Keum et al. | 250/492.21 |
| 6,899,928 B1 * | 5/2005 | Groves et al. | 427/529 |

(Continued)

OTHER PUBLICATIONS

Arendt et al, "YBCO/YSZ Caoted Conductors on Flexible Ni Alloy Substrates", Applied Superconductivity, vol. 4, No. 10-11, Oct./Nov. 1996, p. 429-434.*

(Continued)

*Primary Examiner*—Marianne Padgett
(74) *Attorney, Agent, or Firm*—Larson Newman Abel Polansky & White, LLP (57) ABSTRACT

A method of forming a superconductive device is provided, including providing a substrate having a dimension ratio of not less than about $10^2$, depositing a buffer film to overlie the substrate by ion beam assisted deposition utilizing and ion beam, monitoring spatial ion beam density of the ion beam over a target area, and depositing a superconductor layer to overlie the buffer film. Monitoring may be carried out by utilizing an ion detector having an acceptance angle of not less than 10°.

25 Claims, 9 Drawing Sheets

U.S. PATENT DOCUMENTS

| | | | | |
|---|---|---|---|---|
| 7,026,628 | B2* | 4/2006 | Krueger | 250/397 |
| 7,109,499 | B2* | 9/2006 | Angel et al. | 250/492.21 |
| 2003/0197132 | A1* | 10/2003 | Keum et al. | 250/492.21 |
| 2004/0026118 | A1* | 2/2004 | Muroga et al. | 174/125.1 |
| 2004/0262533 | A1* | 12/2004 | Krueger | 250/397 |
| 2005/0094072 | A1* | 5/2005 | Lu et al. | 349/123 |
| 2005/0239659 | A1* | 10/2005 | Xiong et al. | 505/300 |
| 2006/0097195 | A1* | 5/2006 | Angel et al. | 250/492.21 |
| 2006/0169922 | A1* | 8/2006 | Chang et al. | 250/492.21 |
| 2007/0184596 | A1* | 8/2007 | Ando | 438/172 |

OTHER PUBLICATIONS

Groves et al, "Recent progress in continuosly processed IBAD MgO Template meters for HTS applications", Physica C,382, 2002 (no month)p. 43-47.*

Groves et al, "Development of the IBAD MgO Process for HTS Coated Conductors", Extended Abstracts of the 2001 International Workshop on Superconductivity, Honolulu, HI; Jun. 2001; 4 pages.*

Gnanarajan et al, "YBCO/YSZ/Hastelloy superconducting Tapes by IBAD Magnetron Deposition", Ceramic Transactions, vol. 140; (proceedings of the) Processing High Temperature Superconductors; Goyal et al ed., Apr. 28-May 1, 2002; p. 211-218.*

Foltyn et al, "High-Tc Coated Conductors—Performance of Meter-long YBCO/IBAD Flexible Tapes", IEEE Transactions on Applied Superconductivity, vol. 9, No. 2, Jun. 1999, p. 1519-1522.*

Iijima et al, "Biaxially Aligned YSZ Buffer Layer on Polycrystalline Substrates", Proceedings of the 4th International Simposium on Superconductivity (ISS'91), Oct. 14-17, 1991; Tokyo, Japan; 4 pages.*

Wu et al, "Properties of YBa2Cu3O(7-) Thick Films on Flexible Buffered Metallic Substrates", Appl. Phys. Lett. vol. 67, No. 16, Oct. 16, 1995; p. 2397-2399.*

Iijima et al, "In-Plane Textureing Control of Y-Ba-Cu-O Thin Films on Polycrystalline Substrates by Ion-beam_Modified Intermediate Buffer Layers", IEEE Transactions on Applied Superconductivity, vol. 3, No. 1, Mar. 1993; p. 1510-1515.*

* cited by examiner

SUPERCONDUCTOR FABRICATION PROCESSES

CROSS-REFERENCE TO RELATED APPLICATION(S)

BACKGROUND

1. Field of the Invention

The present invention is generally directed to superconductive articles, and more specifically methods for forming superconductive articles.

2. Description of the Related Art

Superconductor materials have long been known and understood by the technical community. Low-temperature (low-$T_c$) superconductors exhibiting superconductive properties at temperatures requiring use of liquid helium (4.2 K), have been known since about 1911. However, it was not until somewhat recently that oxide-based high-temperature (high-$T_c$) superconductors have been discovered. Around 1986, a first high-temperature superconductor (HTS), having superconductive properties at a temperature above that of liquid nitrogen (77 K) was discovered, namely $YBa_2Cu_3O_{7-x}$ (YBCO), followed by development of additional materials over the past 15 years including $Bi_2Sr_2Ca_2Cu_3O_{10+y}$ (BSCCO), and others. The development of high-$T_c$ superconductors has brought potential, economically feasible development of superconductor components incorporating such materials, due partly to the cost of operating such superconductors with liquid nitrogen rather than the comparatively more expensive cryogenic infrastructure based on liquid helium.

Of the myriad of potential applications, the industry has sought to develop use of such materials in the power industry, including applications for power generation, transmission, distribution, and storage. In this regard, it is estimated that the inherent resistance of copper-based commercial power components is responsible for quite significant losses in electricity, and accordingly, the power industry stands to gain significant efficiencies based upon utilization of high-temperature superconductors in power components such as transmission and distribution power cables, generators, transformers, and fault current interrupters. In addition, other benefits of high-temperature superconductors in the power industry include an increase in one to two orders of magnitude of power-handling capacity, significant reduction in the size (i.e., footprint) of electric power equipment, reduced environmental impact, greater safety, and increased capacity over conventional technology. While such potential benefits of high-temperature superconductors remain quite compelling, numerous technical challenges continue to exist in the production and commercialization of high-temperature superconductors on a large scale.

Among the many challenges associated with the commercialization of high-temperature superconductors, many exist around the fabrication of a superconducting tape that can be utilized for formation of various power components. A first generation of superconducting tape includes use of the above-mentioned BSCCO high-temperature superconductor. This material is generally provided in the form of discrete filaments, which are embedded in a matrix of noble metal, typically silver. Although such conductors may be made in extended lengths needed for implementation into the power industry (such as on the order of hundreds of meters), due to materials and manufacturing costs, such tapes do not represent a commercially feasible product.

Accordingly, a great deal of interest has been generated in the so-called second-generation HTS tapes that have superior commercial viability. These tapes typically rely on a layered structure, generally including a flexible substrate that provides mechanical support, at least one buffer layer overlying the substrate, the buffer layer optionally containing multiple films, an HTS layer overlying the buffer film, and an electrical stabilizer layer overlying the superconductor layer, typically formed of at least a noble metal. However, to date, numerous engineering and manufacturing challenges remain prior to full commercialization of such second generation-tapes.

Accordingly, in view of the foregoing, various needs continue to exist in the art of superconductors, and in particular, provision of commercially viable superconducting tapes, methods for forming same, and power components utilizing such superconducting tapes.

SUMMARY

According to an aspect of the present invention, a method of forming a superconductive device is provided including providing a substrate having a dimension ratio of not less than about $10^2$, and depositing a buffer film to overlie the substrate by ion beam assisted deposition utilizing an ion beam. Further, the method calls for monitoring a spatial ion beam density of the ion beam over a target area, and depositing a superconductor layer to overlie the buffer film.

According to another embodiment, a method for forming a superconductive device is provided, including providing a substrate having a dimension ratio not less than $10^2$, and depositing a buffer film so as to overlie the substrate by ion beam assisted deposition. Further, monitoring an ion beam density is carried out by utilizing an ion detector having an acceptance angle of not less than 10°. The process further calls for depositing a superconducting layer to overlie the buffer film.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

For the purposes of promoting an understanding of the invention, reference will now be made to embodiments of the present invention as illustrated in FIGS. 1-11 and specific language used to describe the same. The terminology used herein is for the purpose of description, not limitation. Specific structural and functional details disclosed herein are not to be interpreted as limiting, but merely as a basis for the claims as a representative basis for teaching one skilled in the art to variously employ the present invention. Any modifications or variations in the depicted structures and methods of making same, and such further applications of the principles of the invention as illustrated herein, as would normally occur to one skilled in the art, are considered to be within the scope of this invention.

An embodiment of the present invention describes process for deposition of biaxially-textured films as a buffer layer for second-generation high temperature superconducting tapes having a high critical current density. As used herein, the critical current density refers to a measurement of current carrying capacity, and is abbreviated $J_c$, measured in amperes/square centimeter ($A/cm^2$ at 0T and 77K).

The critical current density in oxide films is partly dependent upon grain-to-grain misalignments. Higher $J_c$ values are associated with smaller misalignment angles. Devices utilizing aspects of the present invention have good control over the grain alignment of the materials therein, as high-angle boundaries impede current flow. In order to create low-angle grain boundaries in a material, a biaxial texture is established in the material. A biaxially-textured film generally is a polycrystalline material having an in-plane and out-of-plane crystal texture, in which both the crystallographic in-plane and out-of-plane grain-to-grain misorientation of the surface is less than about 30°, such as less than about 20°, 15°, 10°, or 5°, but often times greater than about 1°. The degree of biaxial texture can be described by specifying the distribution of grain in-plane and out-of-plane orientations as determined by x-ray diffraction. A full-width-half-maximum (FWHM) of the rocking curve of the out-of-plane ($\Delta\omega$) and in-plane ($\Delta\phi$) reflection can be determined. Therefore, the degree of biaxial texture can be defined by specifying the range of $\Delta\omega$ and $\Delta\phi$ for a given sample.

According to an embodiment, the IBAD (ion beam assisted deposition) system functions to deposit the biaxially textured buffer layers of HTS tapes. In this system, there is/are evaporator sources providing flux of atoms or atom clusters toward the substrate tape to form the buffer layer on the substrate. In order to obtain biaxial texture in the buffer layer during deposition, an energetic ion beam from an ion source inside the system is arranged to simultaneously bombard the buffer layer during deposition at a oblique incident angle from substrate normal. The ion to atom arrival ratio, which is defined as the ratio of ions arriving at an area of tape within a time interval to atoms arriving on same area of the tape within same time interval, affects the biaxial texture obtained in the buffer layer.

Figure 8:
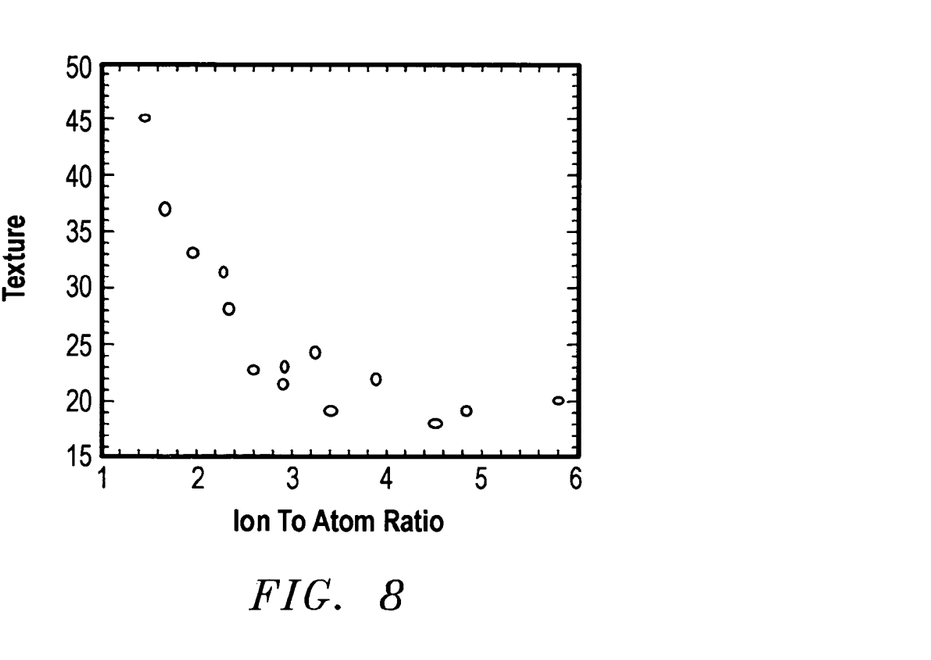
FIG. 8 illustrates the effect of ion to atom ratio on crystallographic texture of a deposited film.

FIG. 8 shows an example of how ion to atom arrival ratio effects texture of said biaxially-textured buffer layer. For clarity, the y-axis showing texture represents the full width half maximum FWHM angle of phi-scan measured from a deposited sample, the lower the angular measurement, the better the crystallographic alignment in the deposited film. In this regard, the FWHM values typically denote the degree of in-plane alignment of the biaxially textured buffer film. So it is important to monitor and control the ion to atom arrival ratio in order to get best biaxial texture in said buffer layer. In order to monitor the ion to atom arrival ratio, it is necessary to monitor the ion beam density profile over deposition zone and atom flux profile over deposition zone. The atom flux profile over deposition zone is monitored by scanning a crystal thickness sensor or sensor array over deposition zone, the ion beam density profile over deposition zone is monitored by scanning faraday cup or faraday cup array over the deposition. According to measured ion beam profile, we can adjust position, angle and parameters of ion source to match ion beam density profile with atom flux profile to make ion to atom arrival ratio at each point of deposition zone as optimal as possible. By doing this, the best texture and highest throughput of biaxially textured buffer tape can be obtained.

According to an aspect of the present invention, fabrication of a superconductive article begins with provision of a substrate. The substrate is generally metal-based, and typically, an alloy of at least two metallic elements. Particularly suitable substrate materials include nickel-based metal alloys such as the known Inconel® group of alloys. The Inconel® alloys tend to have desirable thermal, chemical and mechanical properties, including coefficient of expansion, thermal conductivity, Curie temperature, tensile strength, yield strength, and elongation. These metals are generally commercially available in the form of spooled tapes, particularly suitable for superconductor tape fabrication, which typically will utilize reel-to-reel tape handling.

The substrate is typically in a tape-like configuration, having a high dimension ratio. For example, the width of the tape is generally on the order of about 0.4-10 cm, and the length of the tape is typically at least about 100 m, most typically greater than about 500 m. Indeed, embodiments of the present invention provide for superconducting tapes that include a substrate having a length on the order of 1 km or above. Accordingly, the substrate may have a dimension ratio which is fairly high, on the order of not less than $10^2$, or even not less than $10^3$. Certain embodiments are longer, having a dimension ratio of $10^4$ and higher. As used herein, the term 'dimension ratio' is used to denote the ratio of the length of the substrate or tape to the next longest dimension, the width of the substrate or tape.

Figure 1A:
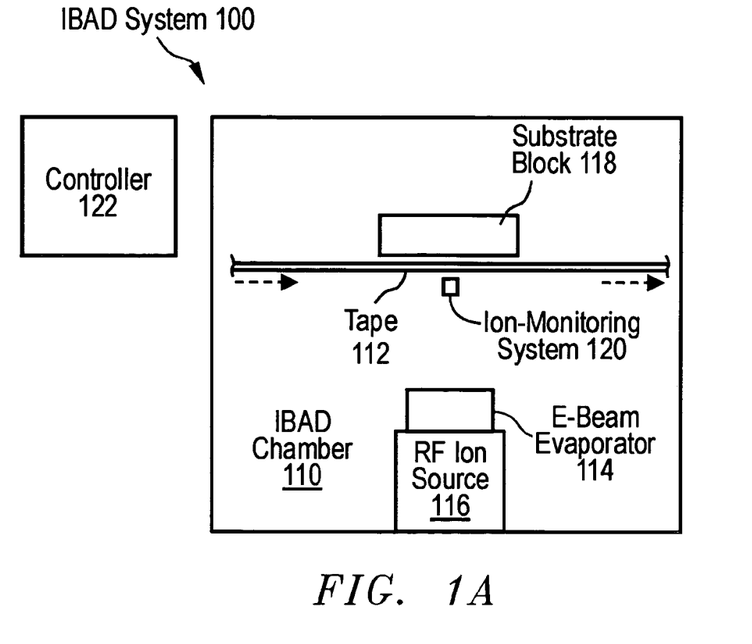
FIGS. 1A-1B illustrate an ion beam assisted deposition (IBAD) system according to an embodiment of the present invention.
Figure 1B:
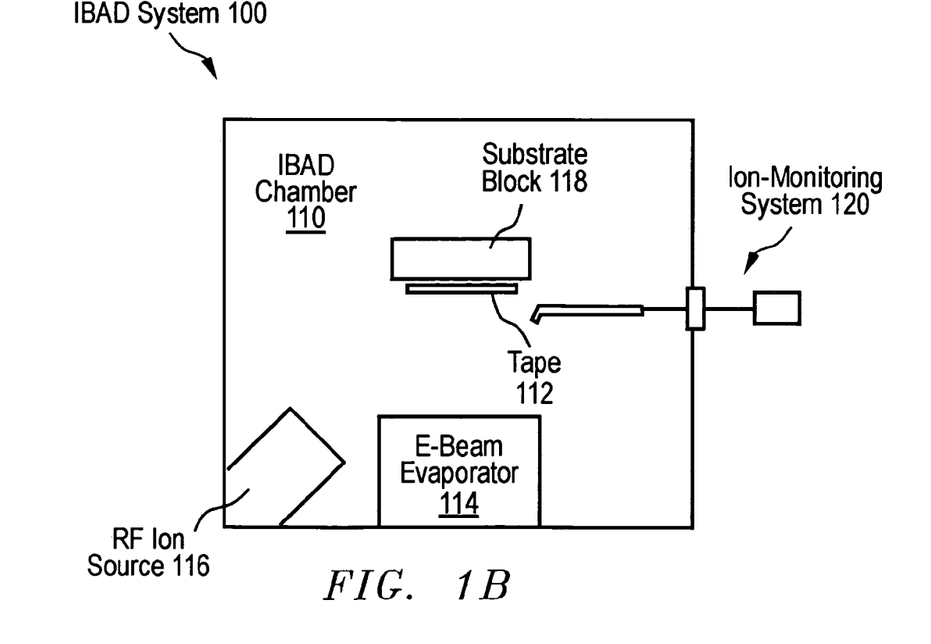

FIGS. 1A and 1B illustrate a front view and a side view, respectively, of an IBAD system 100. The IBAD system 100 includes an IBAD chamber 110 that is a vacuum chamber. The IBAD chamber 110 may be constructed of any non-corroding metal, such as 304 stainless steel, and is generally constructed to obtain a base pressure on the order of $10^{-7}$ Torr. The IBAD chamber 110 houses electron beam (e-beam) evaporators 114 centered horizontally with the substrate block 118 An ion detector, such as in the form of a faraday cup, of ion-monitoring system 120 translates through a range of positions within the IBAD chamber 110 and is at times aligned with an ion source 116, which may be embodied as a radio frequency (RF) ion source. The deposition zone is an area on the bottom surface, that is, the surface of the substrate block facing the e-beam evaporator, of the substrate block where tapes 112 receive deposit from the e-beam evaporator 114 and is bombarded by ions form the ion source 116. This area is usually defined by an aperture close to the bottom surface of the substrate block. The aperture prevents tape outside the deposition zone from receiving deposition and ion bombardment. The ion source 116 is disposed with respect to the substrate block 118 such that a beam of ions is directed toward a translating substrate tape 112 at an incident angle of, for example, 55 degrees, from the tape normal. The IBAD system 100 further includes a controller 122 that is in communication with and controls the operation of certain elements within the IBAD chamber 110. The controller 122 may be one or more micro-controllers or a PC. While particular reference is made to e-beam evaporation sources, others may be employed as well, including a resistively heated evaporation source, an ion beam sputtering source, or magnetron sputtering source.

The tape 112 is a polished length of polished substrate, as generally described above. The tape 112 translates through the IBAD chamber 110 via the action of a reel-to-reel spooling system (not shown) while ion beam assisted film deposition occurs along the portion of the tape within the deposition zone defined above.

The substrate block 118 is a long, typically metal block having an internal coolant passageway loop. The length of the substrate block bottom surface 118 may range from 20 cm to 100 meters, for example. The width of the substrate block 118 may range from 1 cm to 10 m. Typically, the bottom surface of the substrate block has similar dimensions as the cross section of the ion beam from the ion source to make good use of the ion source bombardment area. In addition, the substrate block 118 may include a shutter that can be opened to expose the deposition zone to the ion beam and deposition flux from the evaporator during the IBAD process and can be closed to prevent tape from ion beam bombardment and deposition from the evaporator according to process requirements. The substrate block 118 is positioned within the IBAD chamber 110 so that a deposition zone for the tape 112 is created at the bottom surface of the substrate block 118.

The ion-monitoring system 120 is a translatable device capable of collecting and detecting ions. The ion-monitoring system 120 is further described in reference to FIG. 2. In another embodiment, ion detector of the ion-monitoring system 120 can be replaced by an ion detector array, as is further described in reference to FIG. 4.

The IBAD system 100 is a high-throughput system that deposits the biaxially textured buffer layers of HTS tapes. The ion-monitoring system 120, described in reference to subsequent figures, is particularly well suited for use in the large deposition zone to measure the spatial distribution of ion density along the deposition zone. In operation, the tape 112 translates through the IBAD chamber 110 and makes contact with the substrate block 118 in the deposition zone. The tape 112 is exposed to vapor emitted from the e-beam evaporator 114. Simultaneously, the tape 112 is bombarded by ions emitted from the ion source 116. A thin film buffer layer formed of, for example, YSZ (yttrium-stabilized zirconia), $CeO_2$, MgO, NiO, $Y_2O_3$, $TiO_2$, $SnO_2$, $Mn_3O_4$, $Fe_3O_4$, $CU_2O$, $RE_2O_3$, or combinations thereof are thereby deposited atop the tape 112. The ion-monitoring system 120 samples the ions released from the ion source 116 through a range of points under the substrate block 118 and relates the data to the controller 122. The controller 122 makes adjustments to the operation of the IBAD system 100 based on data from the ion monitoring system 120. The tape 112 winds onto a spool and is stored for subsequent deposition of a superconducting layer, such as yttrium-barium-copper-oxide (YBCO), which may occur in a separate deposition system.

Figure 2A:
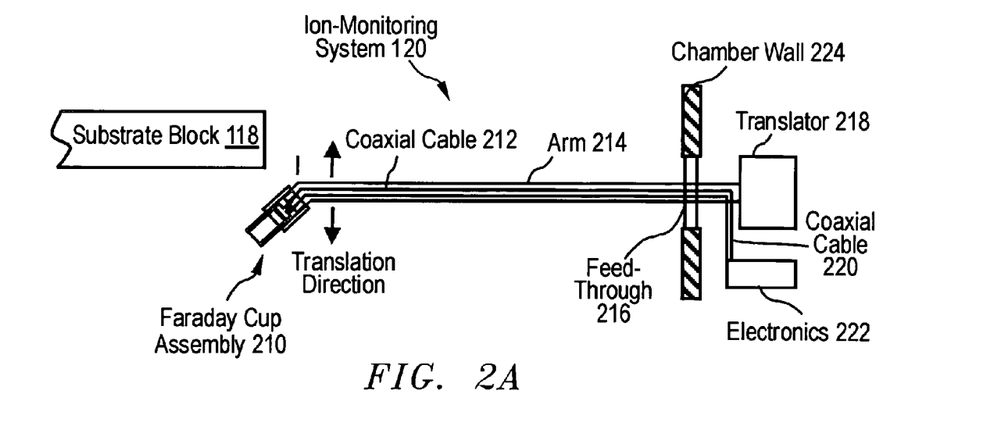
FIGS. 2A and 2B illustrate additional details of the IBAD system, including provision of a Faraday cup assembly.
Figure 2B:
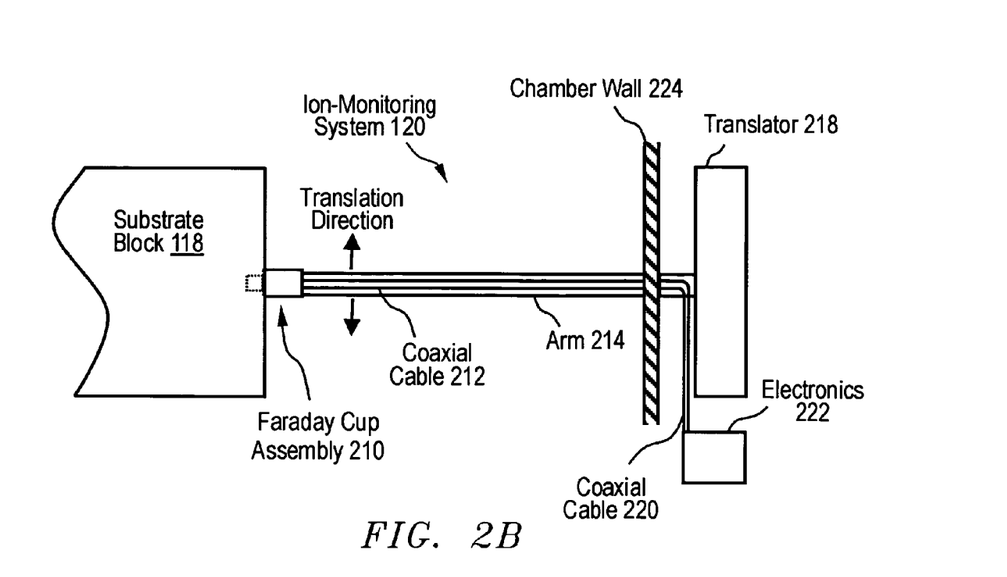

FIGS. 2A and 2B illustrate a side view and a top view, respectively, of the ion-monitoring system 120. The ion-monitoring system 120 includes a Faraday cup assembly 210 that is positioned directly below the substrate block 118 at an angle of, for example, 55 degrees from the normal of the tape 112, such that the Faraday cup assembly 210 is directly aligned with the stream of ions emitted from the ion source 116 and can be moved away from the path between the ion source 116 and the tape 112. The Faraday cup assembly 210 is a device that collects ions emitted from the ion source 116. The Faraday cup assembly 210 is further described in reference to FIG. 6

A shield cable 212 functionally connects the Faraday cup assembly 210 such that a signal line exists from the faraday cup 210 through shield cable 212 to the measurement electronics. The arm 214 is a rigid pipe or beam capable of supporting the Faraday cup assembly 210 and the shield cable 212. The arm 214 may be constructed from a variety of materials that are capable of withstanding the environment within the IBAD chamber 110.

The arm 214 passes through a chamber wall 224 via a feed-through 216 such that the arm 214 is free to move laterally and longitudinally within the feed-through 216 that maintains a seal capable of withstanding pressures down to $10^{-7}$ Torr. The arm 214 is functionally connected to a translator 218. The translator 218 is a commercially available mechanism capable of translating the arm 214, the shield cable 212, and the Faraday cup assembly 210 in at least two orthogonal directions, preferably in a plane parallel to the tape 112. Examples of a mechanism may include a linear motor or a rack and pinion mechanism. It is noted that while a particular structure is shown in FIGS. 2A and 2B, it may be modified in various ways. For example, the translation mechanism can be implemented inside the vacuum chamber, which advantageously attenuates the need for having a large feed-through.

Figure 3:
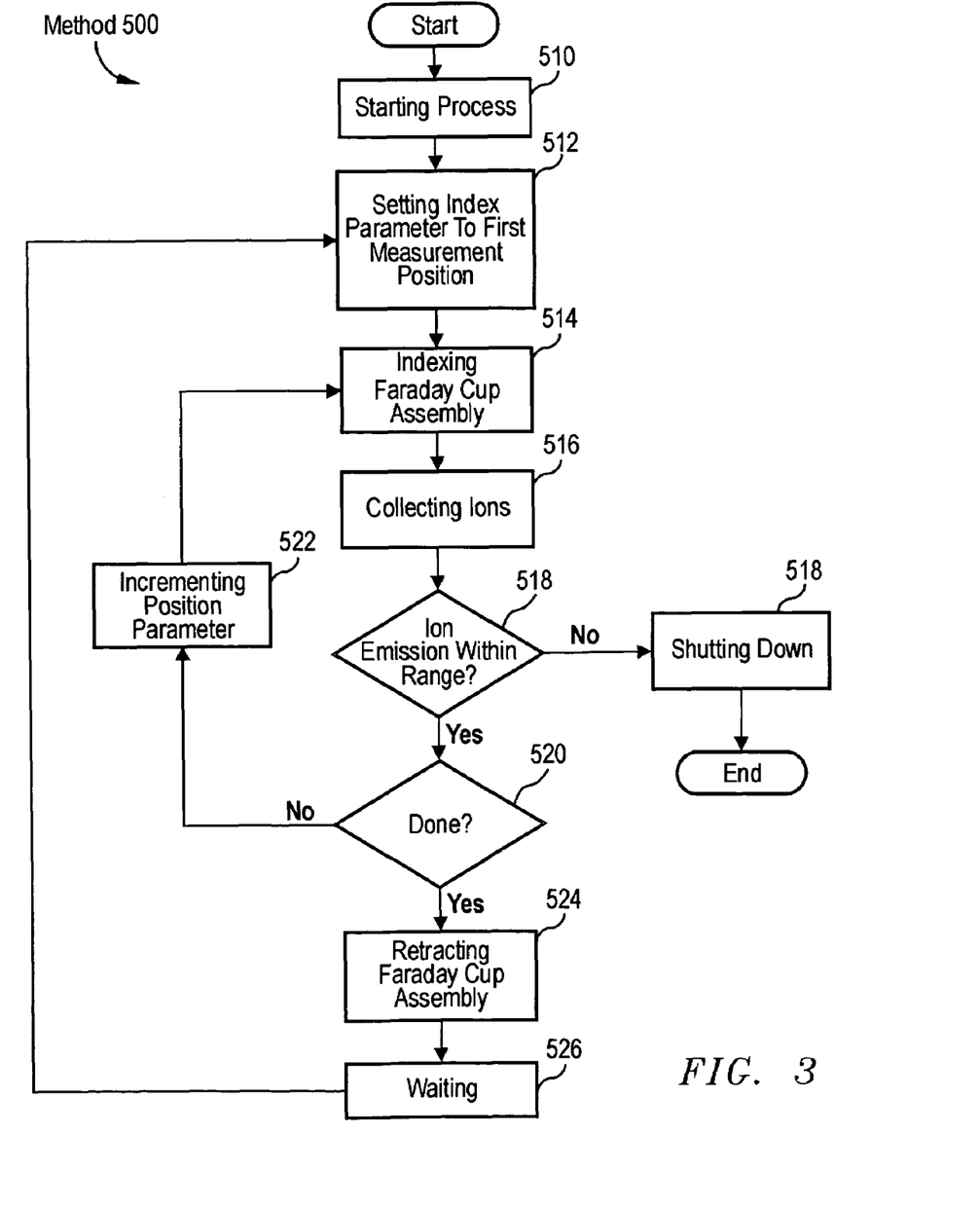
FIG. 3 illustrates a process for operating the IBAD system.

FIG. 3 illustrates a method 500 of using the ion-monitoring system 120 of the present invention, including the following steps.

Step 510: Starting Process

In this step, the tape 112 translates through the IBAD chamber 110 and is subjected to a deposition process in which the tape 112 is exposed to a depositing species emitted from the e-beam evaporator 114 while undergoing simultaneous ion bombardment from the ion source 116. The ion-monitoring system 120 is idle, positioned outside of the deposition zone such that ions emitted from the ion source 116 generally do not contact the Faraday cup assembly 210.

Step 512: Setting Index Parameter to First Measurement Position

In this step, the controller 122 communicates to the ion monitoring system 120 the first of a predetermined series of positions along the deposition zone from which the ion monitoring system 120 is to sample.

Step 514: Indexing Faraday Cup Assembly

In this step, the translator 218 translates the ion-monitoring system 120, more specifically the Faraday cup assembly 210, to the sampling point communicated to it by the controller 122 such that the Faraday cup assembly 210 may collect ions emitted from the ion source 116 at an angle of for example, 55 degrees from the normal of the tape 112.

Step 516: Collecting Ions

In this step, the ion-monitoring system 120 collects and monitors ion emissions from the ion source 116 and communicates the data to the controller 122.

Step 518: Ion Emission within Range?

In this decision step, the controller 122 compares the amount of ions collected to a set value and determines whether the ion emission is within an acceptable range. If yes, method 500 proceeds to step 520. If no, method 500 proceeds to step 518.

Step 520: Done?

In this decision step, the controller 122 determines whether the translator 218 has indexed the Faraday cup assembly 210 through each of a number of predetermined positions along the deposition zone. If yes, method 500 proceeds to step 524; if no, method 500 proceeds to step 522.

Step 522: Incrementing Position Parameter

In this step, the controller 122 communicates to the ion-monitoring system 120 the next in a predetermined series of positions along the deposition zone from which the ion monitoring system 120 is to sample.

Step 524: Retracting Faraday Cup Assembly

In this step, the translator 218 retracts the Faraday cup assembly 210 to a position outside of the deposition zone such that the bulk of ions emitted from the ion source 116 do not contact the Faraday cup assembly 210.

Step 526: Waiting

In this step, the Faraday cup assembly 210 rests in an idle waiting pattern for a predetermined amount of time. During this time, the ion-monitoring system 120 may monitor the ions detected at that location.

Step 518: Shutting Down

In this step, the IBAD system 100 is shut down, an error message is displayed via the controller 122, and production is halted. For example, the controller 122 may close the shutter (not shown) and halt the translation of the tape 112. Method 500 ends.

Alternatively to shutting down, if the measured profile is outside a predetermined specification, any one of or several processing parameters may be adjusted, including those relating to the ion source, ion source position, etc. to bring the profile to within specification.

Figure 4:
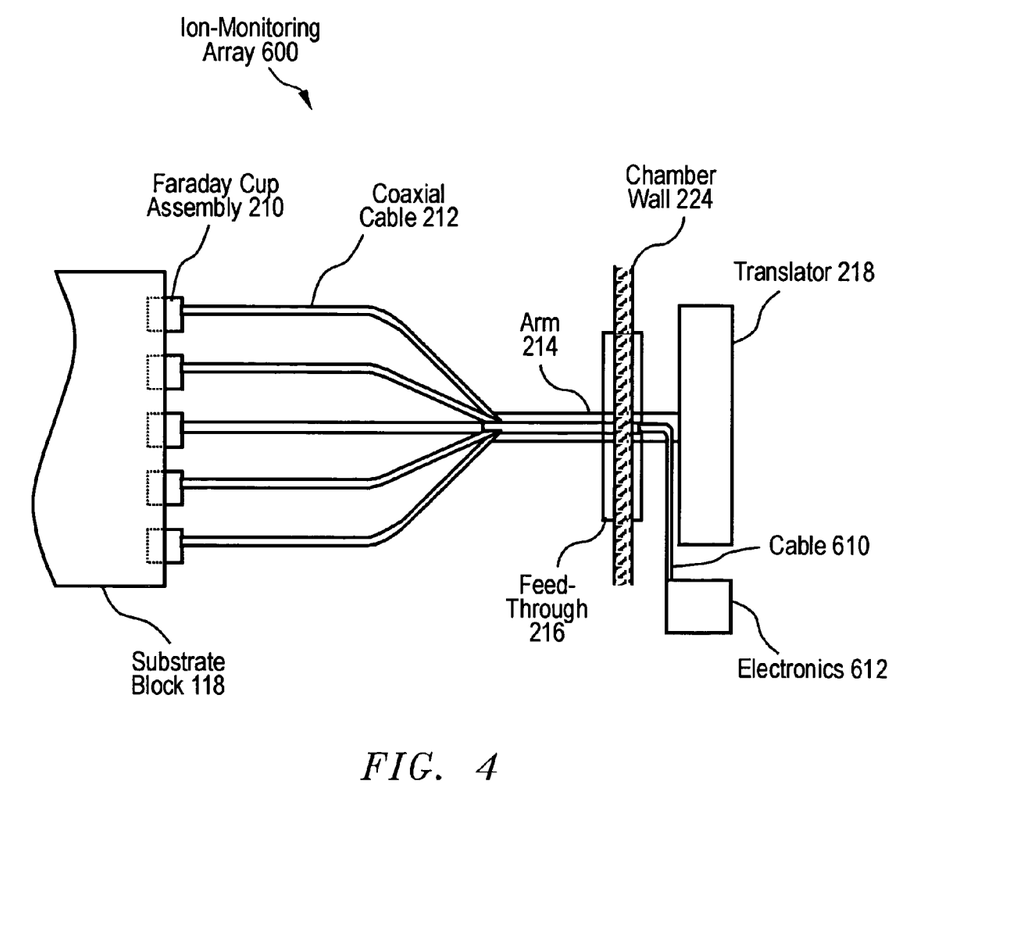
FIG. 4 illustrates an alternative embodiment of a Faraday cup assembly.

Another embodiment of the present invention replaces the ion-monitoring system 120 of the first embodiment with an array of multiple ion-monitoring instruments.

FIG. 4 shows an ion-monitoring array 600 according to another embodiment. The ion-monitoring array 600 includes multiple instantiations of the Faraday cup assembly 210 functionally connected to corresponding multiple instantiations of the shield cable 212, which in turn are functionally connected to the electronics 612 such that a signal line exists from each of the multiple instantiations of the shield cable 212 through the arm 214. The arm 214 passes through the feed-through 216 such that the arm 214 is free to move laterally and longitudinally within the feed-through 216 of the chamber wall 224 while maintaining a seal capable of withstanding pressures down to $10^{-7}$ Torr. The arm 214 is functionally connected to the translator 218 and a cable 610, which in turn is functionally connected to the electronics 612, which exist outside of the IBAD chamber 110. FIG. 4 further includes the substrate block 118, underneath which the ion-monitoring array 600 is positioned such that a series of equally spaced instantiations of the Faraday cup assembly 210 exist over a profile of the substrate block 118.

The cable 610 is a commercially available cable capable of transmitting various signals independently through different channels. The electronics 612 are a system of electronics that detects an ion charge sensed by the Faraday cup assemblies 210 and generates a corresponding electric signal.

In operation, ions enter through the center of the shields 310 contained within the Faraday cup assemblies 210. Ions collide with the collector plates 316. A charge then is then released from the collector plates 316 and is transmitted through the leads 318 (which lie within the shield cables 212), the arm 214, and the cable 610 until it is detected by the electronics 612. The electronics 612 then send a signal to the controller 122 as described in reference to FIG. 1A.

In addition, the translator 218 translates the arm 214, the shield cables 212, and the Faraday cup assemblies 210 of the ion-monitoring array 600 laterally and longitudinally over the profile of the substrate block 118.

Figure 5:
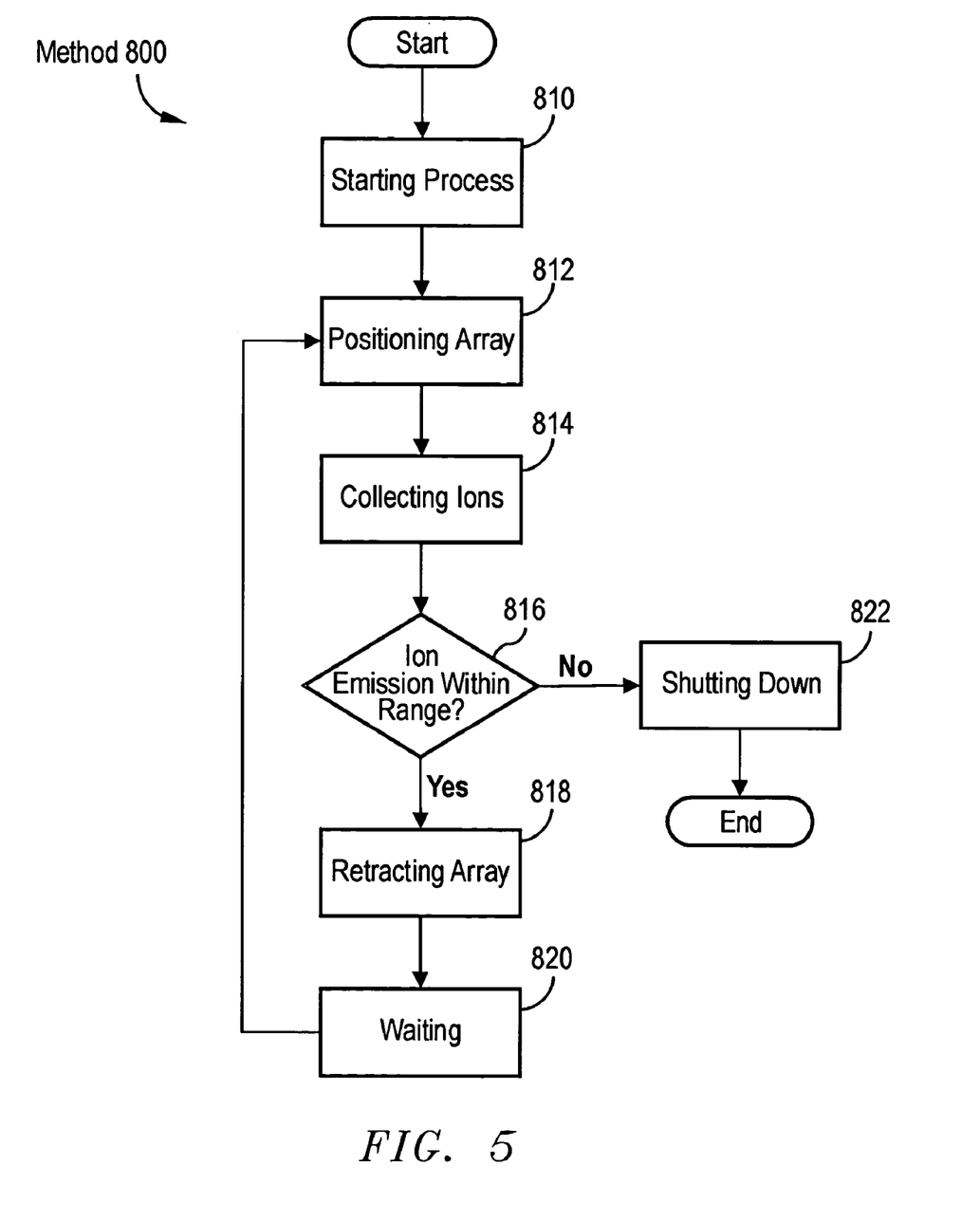
FIG. 5 illustrates a process flow for operating an alternative IBAD system.

FIG. 5. illustrates a method 800 of using the ion-monitoring array 600 of the second embodiment of the invention, including the following steps:

Step 810: Starting Process

In this step, the tape 112 translates through the IBAD system 100 and is subjected to a deposition process in which the tape 112 is exposed to a depositing species emitted from the e-beam evaporator 114 while undergoing simultaneous ion bombardment from the ion source 116.

Step 812: Positioning Array

In this step, the translator 218 translates the ion-monitoring array 600 along the deposition zone, which exists below the substrate block 118, such that the Faraday cup assemblies 210 encounter ions emitted from the ion source 116 at an angle of about 55 degrees from the normal of the tape 112.

Step 814: Collecting Ions

In this step, the ion-monitoring array 600 collects ion emissions from the ion source 116 and communicates the data to the controller 122.

Step 816: Ion Emission within Range?

In this decision step, the controller 122 compares the amount of ions collected from each of the Faraday cup assemblies 210 in the ion-monitoring array 600 to a set of values and determines whether the ion emission is within an acceptable range. If yes, method 800 proceeds to step 818; if no, method 800 proceeds to step 822.

Step 818: Retracting Array

In this step, the translator 218 retracts the ion-monitoring array 600 to a position outside of the deposition zone such that the bulk of ions emitted from the ion source 116 do not contact the Faraday cup assemblies 210.

Step 820: Waiting

In this step, the ion-monitoring array 600 rests in an idle waiting pattern for a predetermined amount of time. During this time, the ion-monitoring array 600 may monitor the ions detected at that location.

Step 822: Shutting Down

In this step, the IBAD system 100 is shut down, an error message is displayed via the controller 122, and production is halted. For example, the controller 122 may close a shutter (not shown) and halt the translation of the tape 112. Method 800 ends.

Alternatively to shutting down, if the measured profile is outside a predetermined specification, any one of or several processing parameters may be adjusted, including those relating to the ion source, ion source position, etc. to bring the profile to within specification.

Embodiments of the present invention include an ion-monitoring system for monitoring ion current over large areas, such as the enlarged deposition zones of high-throughput IBAD systems. One or more Faraday cup sensors that translate through a range of positions throughout an area of interest are generally provided.

Figure 6:
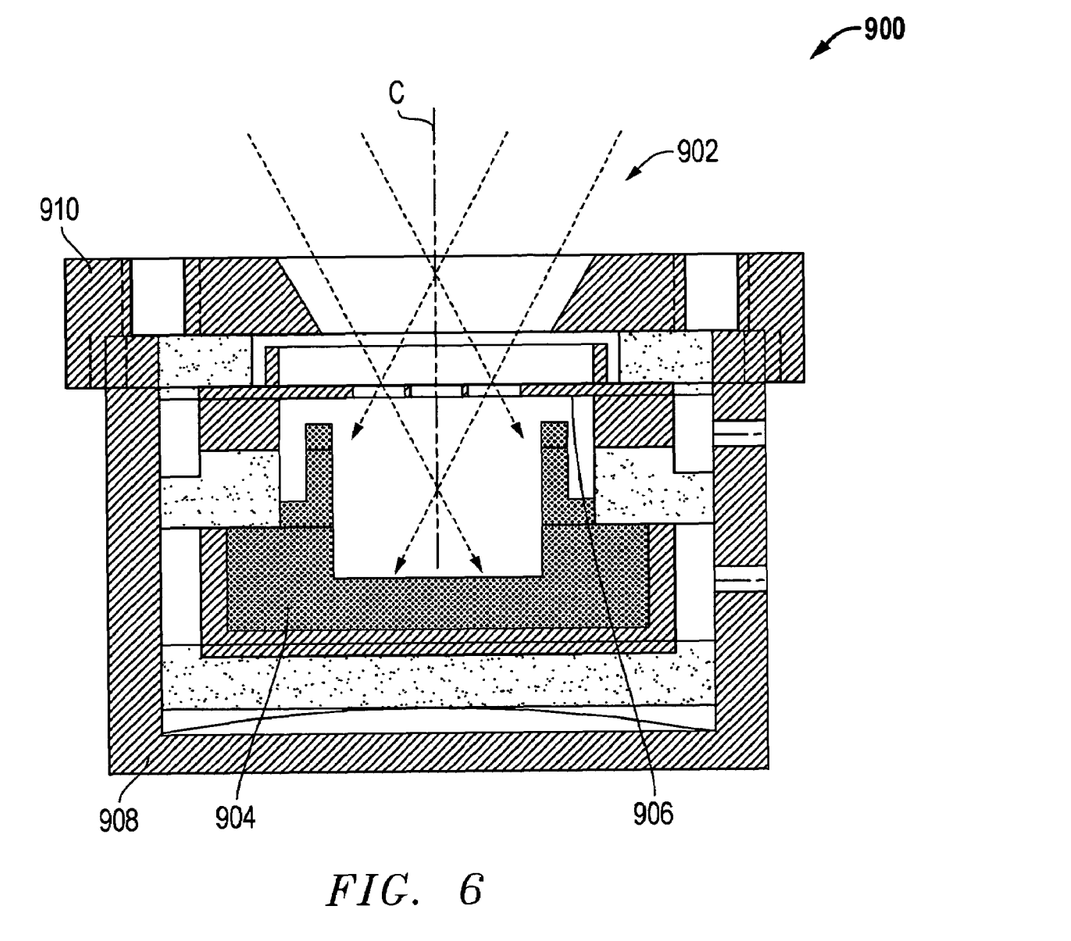
FIG. 6 illustrates another embodiment of an ion detector in the form of a Faraday cup.

Turning to FIG. 6, a particular structure of an ion detector is disclosed. Particularly, the, ion detector is formed of a Faraday cup 900 for detecting ions traveling along trajectory paths 902 as illustrated by the arrows. The particular Faraday cup 900 is configured to accept ions traveling along trajectories at even substantial angles with respect to the central axis of the collector 904. As illustrated, shield 910 included angled surfaces and together with the structure of collector 904, accommodates and detects ions traveling along various angles. In particular, typically the Faraday cup 900 has an acceptance angle not less than about 20°, typically not less than about 30°, such as not less than about 35° or even 40°. Acceptance angle is defined as the angle between the central axis of the Faraday cup with respect to the trajectory path of an incoming ion. Various angles are shown with respect to central axis C. By utilizing a Faraday cup having relatively large acceptance angles as described above, a more accurate measurement of ions in connection with the HTS fabrication process can be detected, providing less sensitivity of Faraday cup misalignment. Turning to other structural aspects, the Faraday cup 900 includes an outer housing 908, within which collector 904 is disposed, generally composed of a conductive carbonaceous material. Still further, the Faraday cup 900 includes a particular bias plate 906, which is generally negatively charged during operation to repel electrons. The bias plate 906 typically has a plurality of holes as shown, and functions to screen electrons from the Faraday cup. Generally, the bias plate has at least two holes, such as three, four, or five holes. Some embodiments have on the order of seven holes or higher. Alternatively described, the bias plate 906 is perforated. Use of a multi-hole bias plate helps repel electrons efficiently and enables fabrication of a small Faraday cup.

Figure 7:
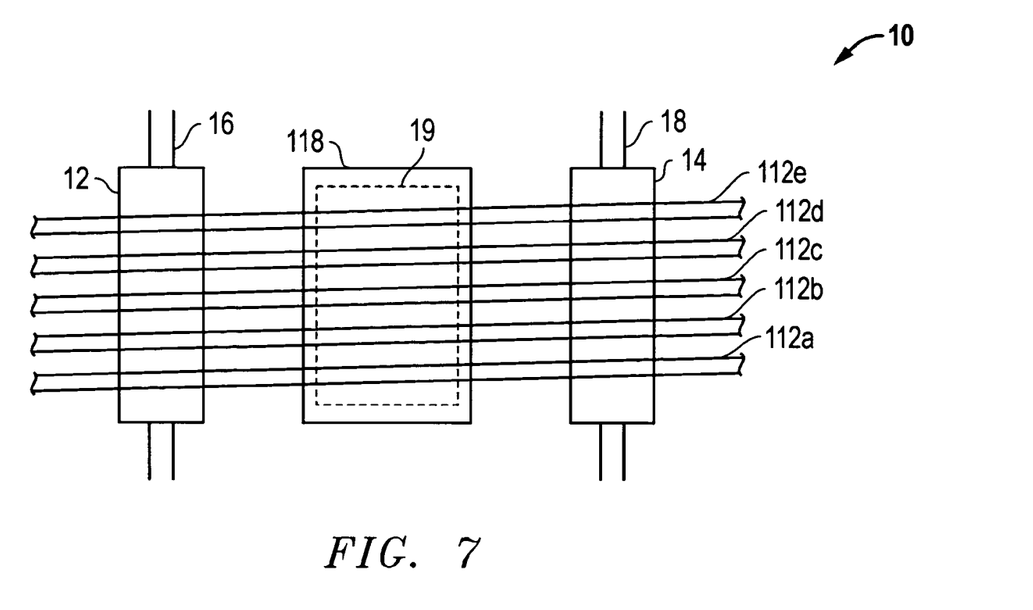
FIG. 7 illustrates a general layout of a multiple-pass translation apparatus for large-scale deposition processing.

FIG. 7 illustrates a layout of a translation apparatus for use in connection with the deposition of a buffer film by the IBAD process described above. Translation system 10 is generally configured to wrap substrate tape 112 various times about first and second rollers 12 and 14 respectively. As shown, the tape segments 112a-112e extend generally parallel to each other but in a slanted configuration with respect to rollers 12 and 14 forming a helical routing structure. The segments 112a-112e are routed about rollers 12 and 14 so as to pass over substrate block 118, defining a deposition zone 19. The segments may be continuously translated over the substrate block 18 by driving the rollers so as to rotate about respective axes 16 and 18. As described above, one or more Faraday cups are employed according to embodiments of the present invention to monitor ion density over substantially the entirety of the deposition zone 19. In this way, ion density as a function of position through the zone may be measured, referred to herein as spatial ion density.

Figure 9:
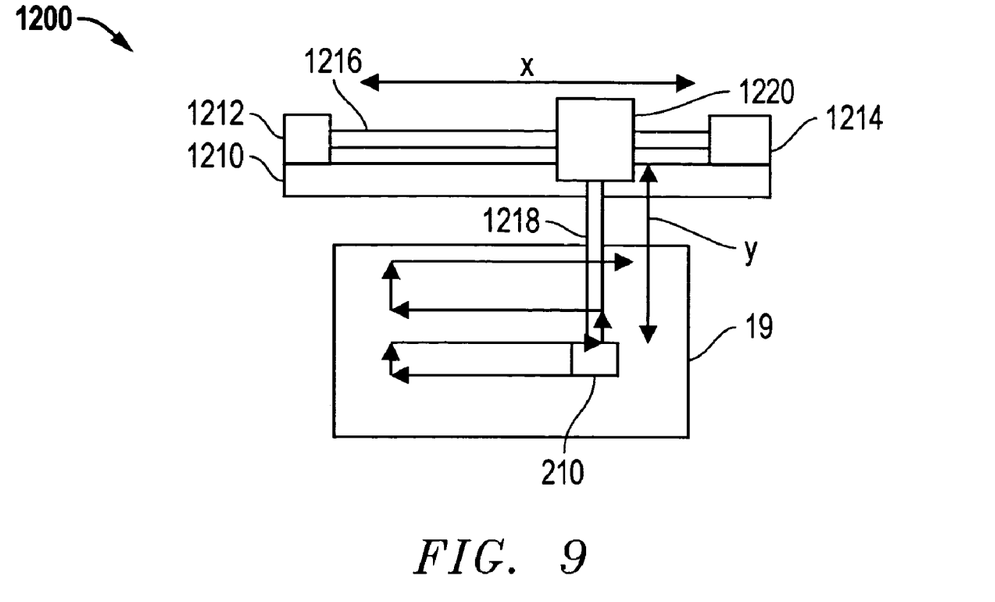
FIGS. 9 and 10 illustrate translation apparatuses for spatial ion density measurement.

FIG. 9 illustrates translation mechanisms of embodiments of the present invention in connection with a single ion detector or Faraday cup assembly. As shown in FIG. 9, a target area or deposition zone may be scanned via a raster-like technique by translating Faraday cup assembly 210 in X and Y directions as illustrated. Translation may be carried out by translation mechanism 1200 that includes a frame 210 to which translation head 1220 is mounted. A rotation drive 1214 cooperates with pulley 212 to drive belt 1216 and translate the head 1220 in the X direction, while head 1220 operates translation arm 1218 to translate the Faraday cup assembly 210 in the Y direction. The embodiment illustrated a single faraday cup, which is cost effective and simple to implement in an IBAD system. However, such implementations generally require extended time intervals to fully characterize an ion beam profile over a large deposition zone.

Figure 10:
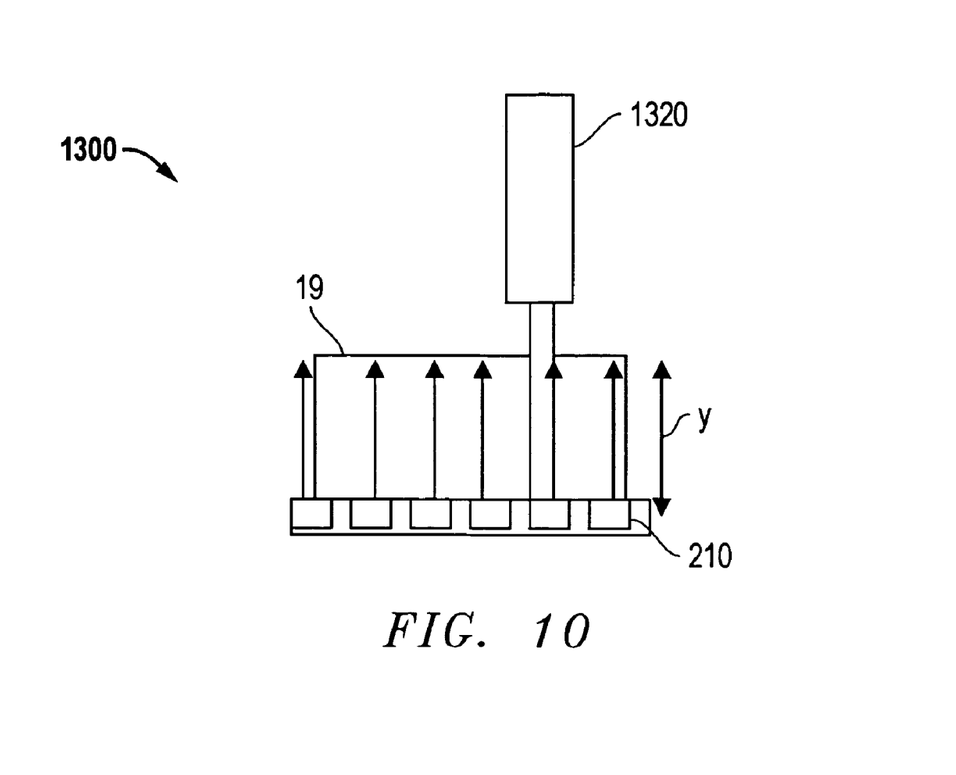

FIG. 10 illustrates translation mechanisms in connection with a Faraday cup array. The Faraday cup assembly 210 having a plurality of Faraday cups or ion detectors arranged along a line forming an array. The array may translated over the Y direction by operating translation mechanism 1300, and in particular, operating translation head 1320 to translate the arm in the Y direction as illustrated. By using an array of Faraday cups, the full width ion density along the X direction can be measured simultaneously, reducing the time needed to fully characterize the ion beam profile over the deposition zone.

Figure 11:
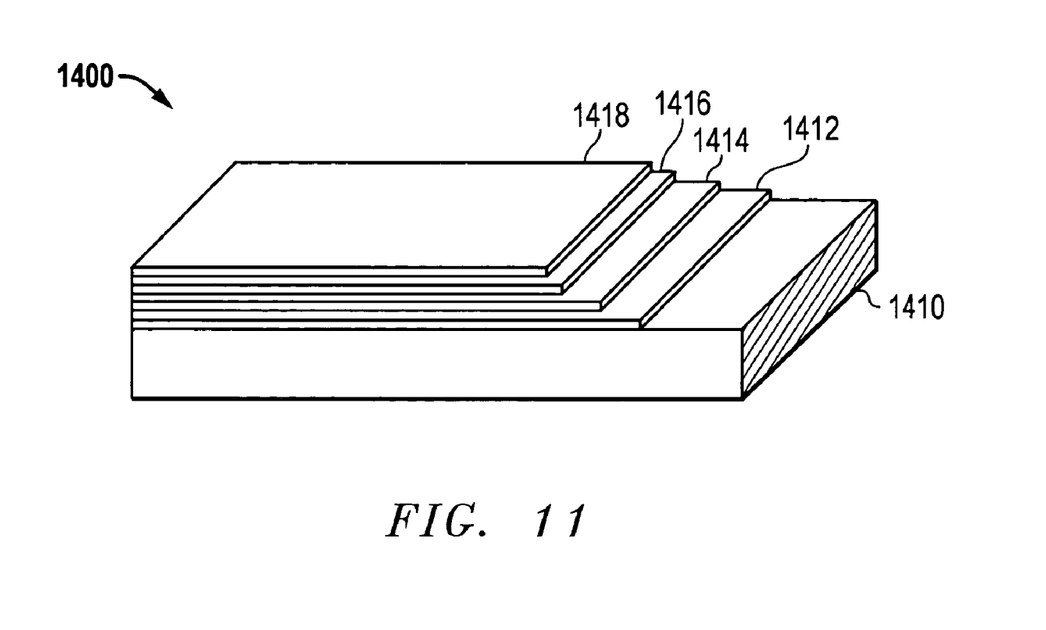
FIG. 11 illustrates the generalized layered structure of a superconductive article formed according to embodiments of the present invention.

Turning to FIG. 11, the general layered structure of a superconductor article according to an embodiment of the present invention is depicted. The superconductor article 1400 includes a substrate 1410, a buffer layer 1412 overlying the substrate 1410, an superconductor layer 1414, followed by a capping layer 1416, typically a noble metal layer, and a stabilizer layer 1418, typically a non-noble metal.

Turning to the buffer layer 1412, the buffer layer may be a single layer, or more commonly, be made up of several films. The buffer layer includes a biaxially textured film formed in accordance with the processing details as discussed above. Magnesium oxide is a typical material of choice for the IBAD film, and may be on the order or 50 to 500 Angstroms, such as 50 to 200 Angstroms. Generally, the IBAD film has a rock-salt like crystal structure, as defined and described in U.S. Pat. No. 6,190,752, incorporated herein by reference. Suitable materials include MgO, NiO, YSZ, $CeO_2$, $Y_2O_3$, $TiO_2$, $SnO_2$, $Mn_3O_4$, $Fe_3O_4$, $Cu_2O$, and $RE_2O_3$ where RE=a rare earth element).

The buffer layer may include additional films, such as a barrier film provided to directly contact and be placed in between an IBAD film and the substrate. In this regard, the barrier film may advantageously be formed of an oxide, such as yttria, and functions to isolate the substrate from the IBAD film. A barrier film may also be formed of non-oxides such as silicon nitride and titanium nitride. Suitable techniques for deposition of a barrier film include chemical vapor deposition and physical vapor deposition including sputtering. Typical thicknesses of the barrier film may be within a range of about 100-200 angstroms. Still further, the buffer layer may also include an epitaxially grown film, formed over the buffer layer. In this context, the epitaxially grown film is effective to increase the thickness of the IBAD film, and may desirably be made principally of the same material utilized for the IBAD layer such as MgO.

In embodiments utilizing an MgO-based IBAD film and/or epitaxial film, a lattice mismatch between the MgO material and the material of the superconductor layer can exist. Accordingly, the buffer layer may further include another buffer film, this one in particular implemented to reduce a mismatch in lattice constants between the superconductor layer and the underlying IBAD film and/or epitaxial film. This buffer film may be formed of materials such as strontium ruthenate, lanthanum manganate, and generally, perovskite-structured ceramic materials. The buffer film may be deposited by various physical vapor deposition techniques.

The superconductor layer 1414, typically in the form of a high-temperature superconductor (HTS) layer, is typically chosen from any of the high-temperature superconducting materials that exhibit superconducting properties above the temperature of liquid nitrogen, 77K. Such materials may include, for example, $YBa_2Cu_3O_{7-x}$, $Bi_2Sr_2Ca_2Cu_3O_{10+y}$, $Ti_2Ba_2Ca_2Cu_3O_{10+y}$, and $HgBa_2Ca_2Cu_3O_{8+y}$. One class of materials includes $REBa_2Cu_3O_{7-x}$, wherein RE is a rare earth element. Of the foregoing, $YBa_2Cu_3O_{7-x}$, also generally referred to as YBCO, may be advantageously utilized. The superconductor layer 514 may be formed by any one of various techniques, including thick and thin film forming techniques. Preferably, a thin film physical vapor deposition technique such as pulsed laser deposition (PLD) can be used for a high deposition rates, or a chemical vapor deposition technique can be used for lower cost and larger surface area deposition. Typically, the superconductor layer has a thickness on the order of about 1 to about 30 microns, most typically about 2 to about 20 microns, such as about 2 to about 10 microns, in order to get desirable amperage ratings associated with the superconductor layer 1414.

The capping layer 1416 and the stabilizer layer 1418 are generally implemented for electrical stabilization, to aid in prevention of superconductor burnout in practical use. More particularly, layers 1416 and 1418 aid in continued flow of electrical charges along the superconductor in cases where cooling fails or the critical current density is exceeded, and the superconductor layer moves from the superconducting state and becomes resistive. Typically, a noble metal is utilized for capping layer 1416 to prevent unwanted interaction between the stabilizer layer(s) and the superconductor layer 1414. Typical noble metals include gold, silver, platinum, and palladium. Silver is typically used due to its cost and general accessibility. The capping layer 1416 is typically made to be thick enough to prevent unwanted diffusion of the components from the stabilizer layer 1418 into the superconductor layer 1414, but is made to be generally thin for cost reasons (raw material and processing costs). Typical thicknesses of the capping layer 1416 range within about 0.1 to about 10.0 microns, such as 0.5 to about 5.0 microns. Various techniques may be used for deposition of the capping layer 1416, including physical vapor deposition, such as DC magnetron sputtering.

The stabilizer layer 1418 is generally incorporated to overlie the superconductor layer 1414, and in particular, overlie and directly contact the capping layer 1416 in the particular embodiment shown in FIG. 5. The stabilizer layer 1418 functions as a protection/shunt layer to enhance stability against harsh environmental conditions and superconductivity quench. The layer is generally dense and thermally and electrically conductive, and functions to bypass electrical current in case of failure in the superconducting layer. It may be formed by any one of various thick and thin film forming techniques, such as by laminating a pre-formed copper strip onto the superconducting tape, by using an intermediary bonding material such as a solder or flux. Other techniques have focused on physical vapor deposition, typically, sputtering, electroless plating, and electroplating. In this regard, the capping layer 1416 may function as a seed layer for deposition of copper thereon.

After completion of the superconductive tape, it may be utilized for from various devices, including commercial or industrial power equipment, such as power distribution or transmission power cables, power transformers, power generators, electric motors, fault current interrupters, and similar devices.

While the invention has been illustrated and described in connection with particular methods for forming superconductive devices, it is not intended to be limited to the details shown, since various modifications and substitutions can be made without departing in any way from the scope of the present invention. For example, additional or equivalent substitutes can be provided and additional or equivalent production steps can be employed. As such, further modifications and equivalents of the invention herein disclosed may occur to persons skilled in the art using no more than routine experimentation, and all such modifications and equivalents are believed to be within the scope of the invention as defined by the following claims.

What is claimed is:

1. A method of forming a superconductive device, comprising:
   providing a substrate having a dimension ratio of not less than about $10^2$;
   translating the substrate through a deposition zone having an area defined by a first direction and a second direction perpendicular to the first direction;
   depositing a buffer film to overlie the substrate along the deposition zone while projecting an ion beam at the buffer film in the area;
   monitoring a spatial ion beam density of the ion beam over the area during depositing the buffer film by translating an at least one ion detector over said area to measure the ion density over said area of the deposition zone, the ion detector comprising a collector for detecting ions from the ion beam and a bias plate overlying the detector through which the ions from the ion beam pass, wherein translating the at least one ion detector is carried out by (i) translating the at least one ion detector in the first direction and the second direction, or (ii) translating an array of the ion detectors in the first direction;
   controlling an ion to atom arrival ratio throughout the area in response to monitoring the spatial ion beam density, wherein the ion to atom arrival ratio represents the number of ions from the ion beam arriving relative to the number of atoms arriving to form the buffer film;
   negatively charging the bias plate to substantially screen electrons from the collector; and
   depositing a superconductor layer to overlie the buffer film.

2. The method of claim 1, further comprising setting deposition conditions based on detected spatial ion density.

3. The method of claim 2, wherein the ion beam is generated from an ion source, and deposition conditions include at least one of operating parameters of the ion source, position of the ion source, angle of the ion beam, and deposition flux density.

4. The method of claim 1, wherein the substrate is routed to make multiple passes through the deposition zone such that a plurality of segments of the substrate are exposed to depositing simultaneously.

5. The method of claim 4, wherein the plurality of segments are generally parallel to each other, the substrate being routed to form a helix.

6. The method of claim 1, wherein depositing is carried out to preferentially align material forming the buffer film.

7. The method of claim 1, wherein the buffer film has a rock salt-like crystal structure.

8. The method of claim 1, wherein the buffer film has a biaxial crystal texture, including crystallographic alignment both in-plane and out-of-plane.

9. The method of claim 1, wherein the buffer film is a film of a buffer layer, the method further comprising depositing additional films to form the buffer layer.

10. The method of claim 9, wherein the additional films include at least one of a barrier film deposited directly on the substrate and an epitaxial film directly overlying the buffer film.

11. The method of claim 1, wherein the superconductor layer has a $T_c$ not less than about 77K.

12. The method of claim 11, wherein the superconductor layer comprises yttrium-barium-copper-oxide.

13. The method of claim 1, further comprising depositing a stabilizer layer overlying the superconductor layer, the stabilizer layer functioning to bypass electrical current in case of failure of the superconductor layer.

14. The method of claim 1, wherein the superconductive device is a superconductive tape.

15. The method of claim 1, wherein the superconductive device is an electric power component incorporating a superconductive tape comprising said substrate, said buffer film, and said superconductor layer.

16. The method of claim 1, wherein the bias plate has a plurality of apertures.

17. The method of claim 1, wherein monitoring is carried out with multiple ion detectors.

18. The method of claim 17, wherein the multiple ion detectors are arranged in an array.

19. The method of claim 1, wherein monitoring and depositing are carried out non-simultaneously such that the steps do not appreciably overlap each other in time.

20. A method of forming a superconductive device, comprising:
providing a substrate having a dimension ratio of not less than about $10^2$;
translating the substrate through a deposition zone having an area defined by a first direction and a second direction perpendicular to the first direction;
depositing a buffer film to overlie the substrate by ion beam assisted deposition along the deposition zone, the ion beam assisted deposition utilizing an ion beam;
monitoring a spatial ion beam density from the ion beam during depositing the buffer film by translating an at least one ion detector over the area, wherein translating the at least one ion detector is carried out by (i) translating the at least one ion detector in the first direction and the second direction, or (ii) translating an array of the ion detectors in the first direction, the at least one ion detector having an acceptance angle of not less than 10°, wherein the acceptance angle is the angle of the trajectory path of incoming accepted ions relative to the central axis of the ion detector, the ion detector further having a collector for detecting ions from the ion beam and a bias plate overlying the detector through which the ions from the ion beam pass;
negatively charging the bias plate to screen electrons from the collector;
controlling an ion to atom arrival ratio throughout the area in response to monitoring the spatial ion beam density, wherein the ion to atom arrival ratio represents the number of ions from the ion beam arriving relative to the number of atoms arriving to form the buffer film; and
depositing a superconductor layer to overlie the buffer film.

21. The method of claim 20, wherein the acceptance angle is not less than about 20°.

22. The method of claim 21, wherein the acceptance angle is not less than about 30°.

23. The method of claim 22, wherein the acceptance angle is not less than about 35°.

24. The method of claim 23, wherein the acceptance angle is not less than about 40°.

25. The method of claim 20, wherein the bias plate has a plurality of apertures.

* * * * *